US008750785B2

(12) United States Patent
Nguyen et al.

(10) Patent No.: US 8,750,785 B2
(45) Date of Patent: Jun. 10, 2014

(54) MODULAR RECEIVING UNIT

(75) Inventors: Linh Nguyen, Germantown, MD (US); Jorge Guzman, Gaithersburg, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 2472 days.

(21) Appl. No.: 11/505,190

(22) Filed: Aug. 16, 2006

(65) Prior Publication Data

US 2007/0149111 A1 Jun. 28, 2007

Related U.S. Application Data

(60) Provisional application No. 60/754,483, filed on Dec. 28, 2005.

(51) Int. Cl.

| | |
|---|---|
| ***H04H 20/74*** | (2008.01) |
| ***H04B 1/08*** | (2006.01) |
| ***H04B 7/00*** | (2006.01) |
| ***H04M 1/00*** | (2006.01) |
| ***H04N 7/00*** | (2011.01) |
| ***H04N 11/00*** | (2006.01) |
| ***H04N 5/44*** | (2011.01) |
| ***H04N 5/46*** | (2006.01) |
| ***H03K 9/00*** | (2006.01) |
| ***H04L 27/00*** | (2006.01) |
| ***H04N 7/18*** | (2006.01) |
| ***H04N 7/16*** | (2011.01) |

(52) U.S. Cl.

USPC ....... 455/3.02; 455/349; 455/526; 455/556.1; 348/552; 348/553; 348/558; 375/316; 725/80; 725/151

(58) Field of Classification Search

CPC ....................... H04N 1/00538; H04N 1/00541

USPC .......... 455/3.02, 150.1, 526, 2.01, 3.01, 3.05, 455/13.2, 169.1, 179.1, 186.1, 188.1, 191.1, 455/209, 290, 302, 349, 414.1, 556.1; 348/725, 726, 729, E5.096, E5.102, 348/E5.128, 14.03, 156, 207.99, 552, 553, 348/558, 564, 607, 706, 731–733; 725/68, 725/70, 71, 72, 85, 100, 120, 131, 139, 151, 725/9, 25, 37, 46, 49, 56, 58, 80, 105, 110, 725/111, 114, 118, 135, 13, 7, 138; 375/316

See application file for complete search history.

(56) References Cited

U.S. PATENT DOCUMENTS

| | | | | |
|---|---|---|---|---|
| 5,018,982 | A * | 5/1991 | Speraw et al. | 439/74 |
| 5,854,904 | A * | 12/1998 | Brown | 710/100 |
| 6,483,553 | B1 * | 11/2002 | Jung | 348/731 |
| 6,490,001 | B1 * | 12/2002 | Shintani et al. | 348/554 |
| 7,109,831 | B2 * | 9/2006 | McMiller et al. | 334/88 |
| 7,440,516 | B2 * | 10/2008 | Kim et al. | 375/316 |
| 2002/0008779 | A1 * | 1/2002 | Ju et al. | 348/552 |
| 2003/0026589 | A1 * | 2/2003 | Barton et al. | 386/46 |
| 2004/0134680 | A1 * | 7/2004 | Dai et al. | 174/255 |
| 2004/0252833 | A1 * | 12/2004 | Milner | 380/200 |
| 2006/0026651 | A1 * | 2/2006 | Kwon et al. | 725/80 |

* cited by examiner

*Primary Examiner* — Yuwen Pan
*Assistant Examiner* — Paul P Tran

(57) ABSTRACT

A receiving unit 28 includes a tuner circuit board 104 that receives a satellite signal. The tuner circuit board 104 demodulates and decodes the satellite signal to form a second signal. The second signal is provided to a processor board 112 that is separated from the tuner and formats the second signal to form an audio signal and a video signal. An integrated bus 100 couples the tuner circuit board 104 and the processor circuit board 112. The integrated bus 100 comprises the second signal, the audio signal and the video signal.

22 Claims, 12 Drawing Sheets

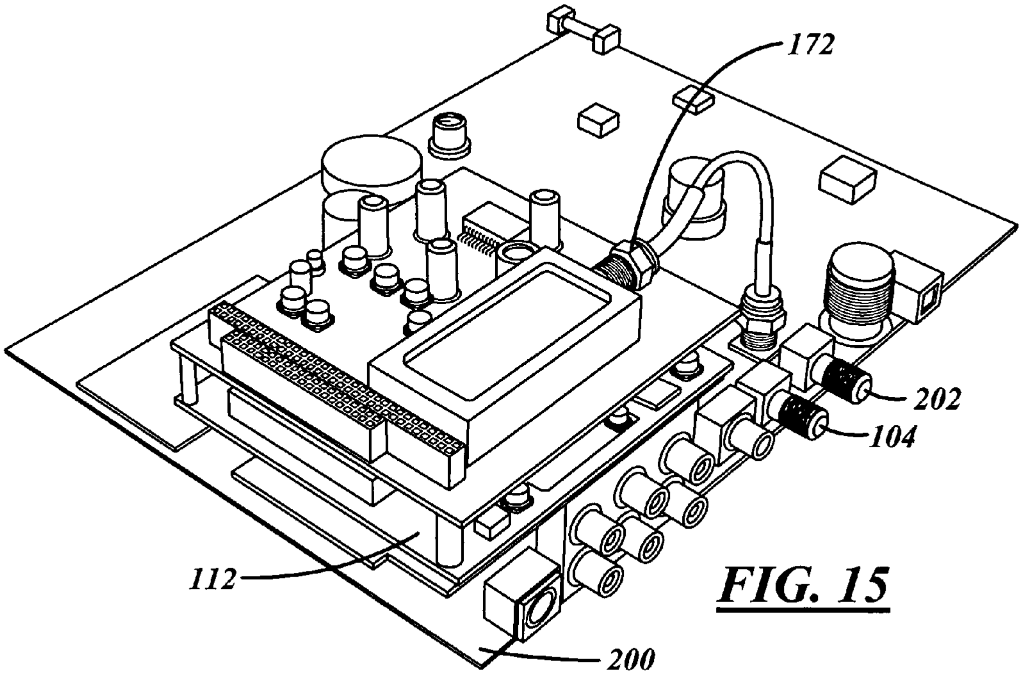

FIG. 15

| | | P1 | | | |
|---|---|---|---|---|---|
| | Pin | Row C | Row B | Row A | |
| | 1 | GND | GND | GND | |
| | 2 | + 3.3V | + 3.3V | | |
| | 3 | GND | GND | GND | Co-Axial |
| | 4 | AUDIO-L1 | AUDIO-L2 | | |
| | 5 | + 3.3V | + 3.3V | + 3.3V | |
| | 6 | AUDIO-R1 | AUDIO-R2 | | |
| | 7 | + 5V | + 5V | + 5V | |
| | 8 | Video-1 | Video-2 | | |
| | 9 | SPDIF | REMOTE | | |
| | 10 | | + 15V | + 15V | |
| | 11 | VID-SY | VID-SC | | |
| | 12 | PWR-PWS | LVA_0 | | |
| | 13 | SCL-2 | SDA-2 | | |
| | 14 | F-DARA(7) | F-DATA(4) | | |
| | 15 | F-DATA(6) | F-DARA(3) | | |
| | 16 | F-DATA(5) | F-DATA(2) | | |
| | 17 | F-RESET | F-DATA(1) | | |
| | 18 | TST-PRS | GND | | |
| | 19 | F-DATA(0) | F-FAIL | | |
| | 20 | F-CLK | GND | | |
| BER | 21 | STR-OUT | F-VALID | | |
| | 22 | SCL-1 | SDA-1 | + 5V | |
| | 23 | DSQ-OUT | LNB-DC | GND | |
| | 24 | DSQ-IN | DSQ-LNB | GND | |
| | 25 | RX-2 | TX-2 | GND | |
| | 26 | Reserve | Reserve | + 3.3V | |
| | 27 | | IO-RESET | + 3.3V | |
| | 28 | RESET_IN_0 | LNB-Control | | |
| | 29 | RX-1 | TX-1 | + 3.3V | |
| | 30 | GND | GND | GND | |
| | 31 | +3.3V | +3.3V | +3.3V | |
| | 32 | GND | GND | GND | Co-Axial |

FIG. 17

| | J1 | | |
|---|---|---|---|
| Pin | | | Pin |
| 1 | GND | GND | 2 |
| 3 | + 3.3V | + 3.3V | 4 |
| 5 | GND | GND | 6 |
| 7 | AUDIO-L1 | AUDIO-L2 | 8 |
| 9 | + 3.3V | + 3.3V | 10 |
| 11 | AUDIO-R1 | AUDIO-R2 | 12 |
| 13 | + 5V | + 5V | 14 |
| 15 | Video-1 | Video-2 | 16 |
| 17 | SPDIF | REMOTE | 18 |
| 19 | | + 15V | 20 |
| 21 | VID-SY | VID-SC | 22 |
| 23 | PWR-PRS | LVA_0 | 24 |
| 25 | SCL-2 | SDA-2 | 26 |
| 27 | F-DATA(7) | F-DATA(4) | 28 |
| 29 | F-DATA(6) | F-DATA(3) | 30 |
| 31 | F-DATA(5) | F-DATA(2) | 32 |
| 33 | F-RESET | F-DATA(1) | 34 |
| 35 | TST-PRS | GND | 36 |
| 37 | F-DATA(0) | F-FAIL | 38 |
| 39 | F-CLK | GND | 40 |
| 41 | STR-OUT | F-VALID | 42 |
| 43 | SCL-1 | SDA-1 | 44 |
| 45 | DSQ-OUT | LNB-DC | 46 |
| 47 | DSQ-IN | DSQ-LNB | 48 |
| 49 | RX-2 | TX-2 | 50 |
| 51 | Reserve | Reserve | 52 |
| 53 | | IO-RESET | 54 |
| 55 | RESET_IN_0 | LNB-Control | 56 |
| 57 | RX-1 | TX-1 | 58 |
| 59 | GND | GND | 60 |
| 61 | + 3.3V | + 3.3V | 62 |
| 63 | GND | GND | 64 |

| | J2 Connector (optional) | | |
|---|---|---|---|
| Pin | | | Pin |
| 1 | | | 2 |
| 3 | + 15V | | 4 |
| 5 | | | 6 |
| 7 | | | 8 |
| 9 | | | 10 |
| 11 | | | 12 |
| 13 | | | 14 |
| 15 | | | 16 |
| 17 | | | 18 |
| 19 | | | 20 |
| 21 | | | 22 |
| 23 | | | 24 |
| 25 | | | 26 |
| 27 | + 5V | *CMDVCC* | 28 |
| 29 | GND | *RSTIN* | 30 |
| 31 | GND | *XTAL1* | 32 |
| 33 | GND | *OFF* | 34 |
| 35 | + 3.3V | *5V_3V* | 36 |
| 37 | + 3.3V | *I_OUT* | 38 |
| 39 | | *AUX1UC* | 40 |

FIG. 16

Signals Description

| Signal Name | pc/104 J1 pin | pc/104 J2 pin | din pin | i/o | Signal Descripton | Type |
|---|---|---|---|---|---|---|
| AUDIO-L1 | 7 | | 4C | O | Left audio #1 | Analog |
| AUDIO-L2 | 8 | | 4B | O | Left audio #2 | Analog |
| AUDIO-R1 | 11 | | 6C | O | Right audio #1 | Analog |
| AUDIO-R2 | 12 | | 6B | O | Right audio #2 | Analog |
| Video-1 | 15 | | 8C | O | Composite video #1 | Analog |
| Video-2 | 16 | | 8B | O | Composite video #2 | Analog |
| SPDIF | 17 | | 9C | O | Digital audio | 3.3V logic |
| REMOTE | 18 | | 9B | I | Remote | 3.3V logic |
| VID-SY | 21 | | 11C | O | S-Video luminance | Analog |
| VID-SC | 22 | | 11B | O | S-Video chrominance | Analog |
| PWR-PRS | 23 | | 12C | O | Power presence | 3.3V logic |
| LVA_0 | 24 | | 12B | I | Low voltage Alarm -- high = normal operation; low = alarm. Alarm must trigger at least 10ms prior to the first DC power rail falling out of spec | 3.3V logic |
| SCL-2 | 25 | | 13C | O | 12C clock #2 | 3.3V logic |
| SDA-2 | 26 | | 13B | I/O | 12C data #2 | 3.3V logic |
| F-DATA(7) | 27 | | 14C | I | Demodulator data bus bit-7 | 3.3V logic |
| F-DATA(6) | 29 | | 15C | I | Demodulator data bus bit-6 | 3.3V logic |
| F-DATA(5) | 31 | | 16C | I | Demodulator data bus bit-5 | 3.3V logic |
| F-DATA(4) | 28 | | 14B | I | Demodulator data bus bit-4 | 3.3V logic |
| F-DATA(3) | 30 | | 15B | I | Demodulator data bus bit-3 | 3.3V logic |
| F-DATA(2) | 32 | | 16B | I | demodulator data bus bit-2 | 3.3V logic |
| F-DATA(1) | 34 | | 17B | I | demodulator data bus bit-1 | 3.3V logic |
| F-RESET | 33 | | 17C | O | Demodulator reset | 3.3V logic |
| F-FAIL | 38 | | 19B | I | Demodulator frame fail | 3.3V logic |
| TST-PRS | 35 | | 18C | I | Test card present - H:not-present, L:present Once Testcard is present, it will provide external 13/18/22kHz/DiSEqC, RS232 level dataport and IR/RF remote control functions | 3.3V logic |
| F-DATA(0) | 37 | | 19C | I | Demodulator data bus bit-0 | 3.3V logic |
| F-CLK | 39 | | 20C | I | Demodulator clock | 3.3V logic |
| STR-OUT | 41 | | 21C | I | Demodulator strobe | 3.3V logic |
| F-VALID | 42 | | 21B | I | Demodulator frame valid | 3.3V logic |
| SCL-1 | 43 | | 22C | O | 12C clock #1 | 3.3V logic |
| SDA-1 | 44 | | 22B | I/O | 12C data #1 | 3.3V logic |
| DSQ-OUT | 45 | | 23C | O | DiSEqc OUT | 3.3V logic |
| LNB-DC | 46 | | 23B | I | External DC access to F-connector | Analog |
| DSQ-IN | 47 | | 24C | I | DiSEqc IN | 3.3V logic |
| DSQ-LNB | 48 | | 24B | O | 22kHz switch - H:external, L:internal | 3.3V logic |
| LNB-Control | 56 | | 28B | O | LNB 13/18V signaling - H:18Volt, L:13Volt | 3.3V logic |
| RX-2 | 49 | | 25C | O | Serial data OUT #2 | 3.3V logic |
| TX-2 | 50 | | 25B | I | Serial data IN #2 | 3.3V logic |
| Reserve | 51 | | 26C | O | Reserved | 3.3V logic |

A A

*FIG. 18A*

| | | | | | | |
|---|---|---|---|---|---|---|
| Reserve | 52 | | 26B | I | Reserved | 3.3V logic |
| IO-RESET | 54 | | 27B | O | I/O Reset | 3.3V logic |
| RESET_IN_O | 55 | | 28C | I | Main reset for M10 receiver | 3.3V logic |
| RX-1 | 57 | | 29C | O | Serial data OUT #1 | 3.3V logic |
| TX-1 | 58 | | 29B | I | Serial data IN #1 | 3.3V logic |
| CMDVCC | | 28 | | I | Start activation sequence - Active low | 3.3V logic |
| RSTIN | | 30 | | I | Reset to SmartCard | 3.3V logic |
| XTAL1 | | 32 | | I | Input clock to SmartCard | 3.3V logic |
| OFF | | 34 | | O | Interrupt from SmartCard | 3.3V logic |
| 5V_3V | | 36 | | I | SmartCard voltage selection - H:5Volt, L:3:3Volt | 3.3V logic |
| 1_OUTC | | 38 | | I/O | SmartCard data line | 3.3V logic |
| AUX1UC | | 40 | | I/O | SmartCard Data line from C4 | 3.3V logic |

*FIG. 18B*

| Signal Name | pc/104 J1 pin | pc/104 J2 pin | din pin | i/o | Signal Descripton |
|---|---|---|---|---|---|
| +3.3 Volt | 3 | | 2C | I | +3.3 Volt input supply |
| +3.3 Volt | 4 | | 2B | I | +3.3 Volt input supply |
| +3.3 Volt | | | 2A | I | +3.3 Volt input supply |
| +3.3 Volt | 9 | | 5C | I | +3.3 Volt input supply |
| +3.3 Volt | 10 | | 5B | I | +3.3 Volt input supply |
| +3.3 Volt | | | 5A | I | +3.3 Volt input supply |
| | | 35 | 26A | I | +3.3 Volt input supply |
| | | 37 | 27A | I | +3.3 Volt input supply |
| | | | 29A | I | +3.3 Volt input supply |
| +3.3 Volt | 61 | | 31C | I | +3.3 Volt input supply |
| +3.3 Volt | 62 | | 31B | I | +3.3 Volt input supply |
| +3.3 Volt | | | 31A | I | +3.3 Volt input supply |
| +5 Volt | 13 | | 7C | I | +5 Volt input supply |
| +5 Volt | 14 | | 7B | I | +5 Volt input supply |
| +5 Volt | | | 7A | I | +5 Volt input supply |
| +15 Volt | 20 | | 10B | I | +15 Volt input supply |
| +15 Volt | | 3 | 10A | I | +15 Volt input supply |
| GND | 1 | | 1C | I | Ground |
| GND | 2 | | 1B | I | Ground |
| GND | | | 1A | I | Ground |
| GND | 5 | | 3C | I | Ground |
| GND | 6 | | 3B | I | Ground |
| GND | | | 3A | I | Ground |
| GND | 36 | | 18B | I | Ground |
| GND | 40 | | 20B | I | Ground |
| GND | | 29 | 23a | I | Ground |
| GND | | 31 | 24a | I | Ground |

*FIG. 19*

MODULAR RECEIVING UNIT

CROSS-REFERENCE TO RELATED APPLICATION

This application claims the benefit of U.S. Provisional Application No. 60/754,483, filed on Dec. 28, 2005. The disclosure of the above application is incorporated herein by reference.

TECHNICAL FIELD

The present invention relates generally to receiving units and, more particularly, to receiving units particularly suited for mobile satellite television reception.

BACKGROUND

Satellite television has become increasingly popular due to its wide variety of programming. Entertainment in automobiles such as DVD players has also become increasingly popular. It would be desirable to provide a satellite television system for a vehicle so a wide variety of programming may be enjoyed by the rear passengers.

Typical satellite receivers are designed as one integrated unit. That is, the various tuning functions, conditional access functions and processing are all performed on the same circuit board. However, such a device has a relatively large housing. In automotive applications, space is always critical. Therefore, it would be desirable to provide a receiving unit that requires less space.

SUMMARY OF THE INVENTION

A modular satellite device receiver design has an analog front end module separated from the digital processing back end module. The present invention allows either module to be upgraded independently. An interconnecting integrated bus allows the module parts to be joined together and expanded or replaced as more modules are required or are desired. One such module may be a conditional access module for the SmartCard. Pinout connection of the module is designed so that various types of the connectors may be used.

In one feature of the invention, a receiving unit includes a tuner circuit board that receives a satellite signal. The tuner circuit board demodulates and decodes the satellite signal to form a second signal. The second signal is provided to a processor board that is separated from the tuner and formats the second signal to form an audio signal and a video signal. An integrated us couples the tuner circuit board and the processor circuit board. The integrated bus comprises the second signal, the audio signal and the video signal.

Another feature of the invention includes a method of operating a receiver that includes receiving satellite signals from an antenna at a tuner circuit board, demodulating and decoding the satellite signal to form a second signal at the tuner circuit board. The method further includes communicating the second signal through a bus and receiving the second signal in a processor board. The method also includes formatting the second signal to form an audio signal and a video signal in the processor board in communicating the audio and video signal through the bus.

One advantage of the design is that because the design is more compact, mobile applications may easily implement the design. Also, various circuit boards within the design may be upgraded without having to upgrade other boards. This helps reduce the overall cost of maintenance of the system.

The device may be implemented as a stand alone receiver box or may be implemented as an integrated satellite receiver with flat panel display in one compact unit. By providing a common pinout of each of the circuit boards, a connector may allow different types of applications for the module. Various types of groupings for future expansion may be provided and include: audio and video output; demodulator bus; control signals for LNB; (CAM) card interface; $I^2C$ serial control buses and, and low-speed serial port.

Low voltage DC inputs may be defined for easy use of interfacing to various application providers. Each module may be used on its own of this interface to other equipment. Another advantage of the invention is that each module may be redesigned without having to redesign the other modules. Also, by using the modular design, the device may be easily used or configured for residential as well as mobile applications.

Other advantages and features of the present invention will become apparent when viewed in light of the detailed description of the preferred embodiment when taken in conjunction with the attached drawings and appended claims.

BRIEF DESCRIPTION OF THE DRAWINGS

FIG. 15 is a second embodiment of a stack having a tuner circuit board, a processor circuit board and a combination power supply conditional access and connector circuit board.

FIG. 16 is a table illustrating the pinout connection of a J1 and J2 connector.

FIG. 17 is a plot of a DIN pinout.

FIGS. 18A and 18B are a table illustrating various signals, the position on a corresponding connector, a signal description and type.

FIG. 19 is a table illustrating various signals corresponding to power and ground pinouts of a connector.

DETAILED DESCRIPTION

Figure 1:
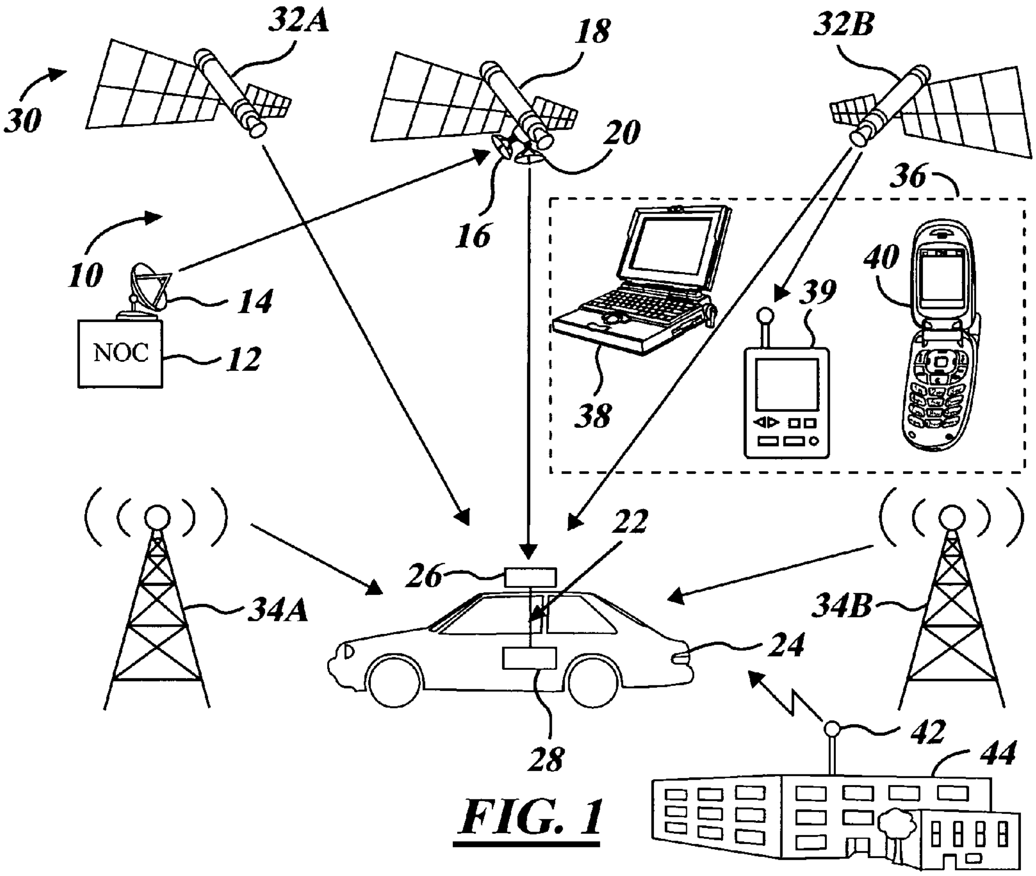
FIG. 1 is a system level view of a satellite broadcasting system according to the present invention.

In the following figures the same reference numerals will be used for the same views. The following figures are described with respect to a mobile satellite television system. However, those skilled in the art will recognize the teachings of the present invention may be applied to various types of mobile reception including land-based type systems.

Referring now to FIG. 1, a satellite television broadcasting system 10 is illustrated. The satellite television broadcasting system 10 includes a network operations center 12 that generates wireless signals through a transmitting antenna 14 which are received by a receiving antenna 16 of a satellite 18. The wireless signals, for example, may be digital. A transmitting antenna 20 generates signals directed to various receiving systems including stationary systems such as those in the home as well as mobile receiving systems 22. The wireless signals may have various types of information associated with them including location information. The wireless signals may also have various video and audio information associated therewith. As illustrated, the mobile receiving system 22 is disposed within an automotive vehicle 24. A receiving antenna 26 receives the wireless signals from the satellite 18 and processes the signals in a mobile receiving unit 28. The mobile receiving unit 28 will be further described below.

The system 10 may also receive location signals from a GPS system 30 that includes a first satellite 32A and a second satellite 32B. Although only two satellites are shown, a typical GPS system includes several satellites, several of which may be in view at any particular time. Triangulation techniques may be used to determine the elevation, latitude and longitude of the system. A locating system may also include cellular towers 34A and 34B that may be used by the mobile receiving system 22 to determine a location. Cellular phones typically include a GPS locating system. As the vehicle 24 moves about, the exact coordinates in latitude and longitude may be used to determine the proper designated marketing area for local television and broadcasting.

The present invention may also be used for displaying various wireless information on a personal mobile device 36 such as a laptop computer 38, a personal digital assistant 39, and a cellular telephone 40. It should be noted that these devices and the automotive-based devices may also receive wireless signals having various types of information associated therewith from the cellular towers 34A and 34B. Other types of information may be broadcast from various other types of broadcasting areas such as an antenna 42 on a building 44. The building 44 may be various types of buildings such as a store and the wireless information transmitted from the antenna 42 may be advertising information. All of the wireless signals preferably include location information transmitted therewith. As will be described below, the information may be coded digitally into the signals. Thus, by reviewing the location information, signals appropriate for the location of the mobile devices may be displayed on the various devices. This will be further described below.

Figure 2:
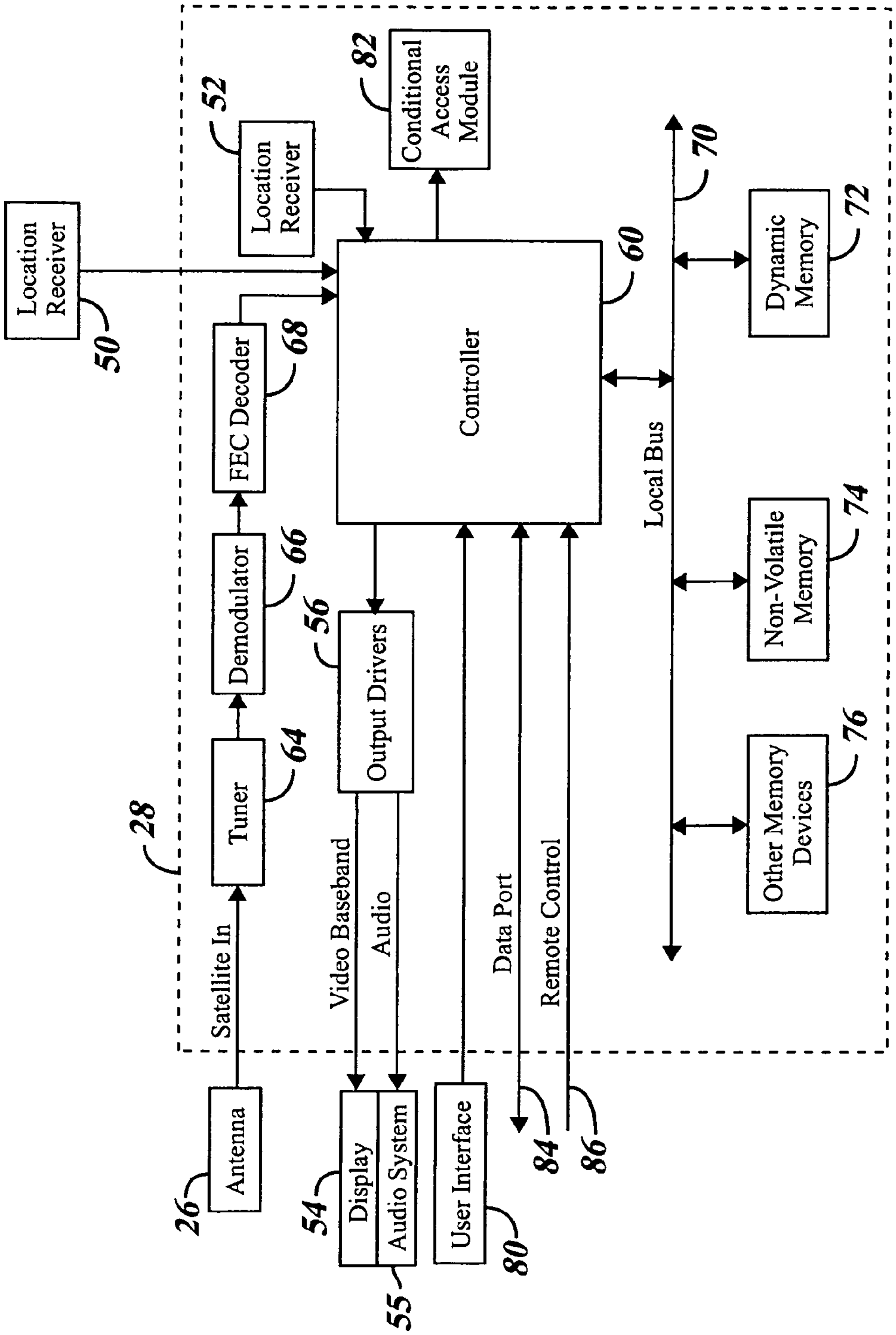
FIG. 2 is a block diagrammatic view of a vehicle having a receiving system according to the present invention.

Referring now to FIG. 2, a receiving unit 22 is illustrated in further detail. Antenna 26 may be various types of antennas including a rotating antenna which is used to track the relative movement of the satellite or other transporting device with respect to the vehicle. The antenna 26 may be a single antenna used for satellite television reception, or a number of antennas such as one for receiving television signals and one coupled to a GPS location receiver 50. The antenna 26 may also be an electronic antenna.

The mobile receiver unit 28 is coupled to antenna 26. The mobile receiving unit 28 may also include a location receiver 52 integrated therein. The location receiver 52 may be a GPS receiver. In a preferred embodiment, only one location receiver 50, 52 may be provided in the system. However, the location receiver 50, 52 may be part of the vehicle 24 or may be part of the mobile receiving system 22, 36. The controller 60 may be coupled directly to location receiver 52 and/or location receiver 50. The mobile receiving unit 28 includes a display 54. The display 54 may be incorporated into the device 36 or within the vehicle 24. The display 54 may include output drivers 56 used for generating the desired audio and video outputs suitable for the particular display 54. The display 54 may include an audio system 55 or be coupled to a separate audio system 55.

A controller 60 may be a general processor such as a microprocessor. The controller 60 may be used to coordinate and control the various functions of the receiving unit 28. These functions may include a tuner 64, a demodulator 66, a forward error correction decoder 68 and any buffers and other functions. The timer 64 receives the signal or data from the individual channel. The demodulator 66 demodulates the signal or data to form a demodulated signal or data. The decoder 68 decodes the demodulated signal to form decoded data or a decoded signal. The controller 60 may be similar to that found in current DirecTV set top boxes which employ a chip-based multifunctional controller.

The controller 60 may include or be coupled to a local bus 70. The local bus 70 may be used to couple a dynamic memory 72 such as RAM which changes often and whose contents may be lost upon the interruption of power or boot up. The bus 70 may also be coupled to a non-volatile memory 74. The non-volatile memory may be an in-circuit programmable type memory. One example of a non-volatile memory is an EEPROM. One specific type of EEPROM is flash memory. Flash memory is suitable since it is sectored into blocks of data segments that may be individually erased and rewritten.

Other memory devices 76 may also be coupled to local bus 70. The other memory devices may include other types of dynamic memory, non-volatile memory, or may include such devices such as a digital video recorder. The display 54 may be changed under the control of controller 60 in response to the data in the dynamic memory 72 or non-volatile memory 74.

The controller 60 may also be coupled to a user interface 80. User interface 80 may be various types of user interfaces such as a keyboard, push buttons, a touch screen, a voice activated interface, or the like. User interface 80 may be used to select a channel, select various information, change the volume, change the display appearance, or other functions. The user interface 80 is illustrated as part of the mobile receiving unit. However, should the unit be incorporated into a vehicle, the user interface 80 may be located external to the mobile receiving unit such as dial buttons, voice activated system, or the like incorporated into the vehicle and interface with the mobile receiving unit.

A conditional access module card 82 (CAM) may also be incorporated into the mobile receiving unit. Access cards such as a conditional access module (CAM) cards are typically found in DirecTV units. The access card 82 may provide conditional access to various channels and wireless signals generated by the system. Not having an access card or not having an up-to-date access card 66 may prevent the user from receiving or displaying various wireless content from the system.

A data port 84 may be coupled to the controller 60 for transmitting or receiving information from a device. A remote control 86 may be used as one type of interface device. The remote control 86 provides various data to the controller 60.

The embodiment shown in FIG. 2 illustrates an embodiment for a mobile receiver. The follow shows specific details regarding the device.

Figure 3:
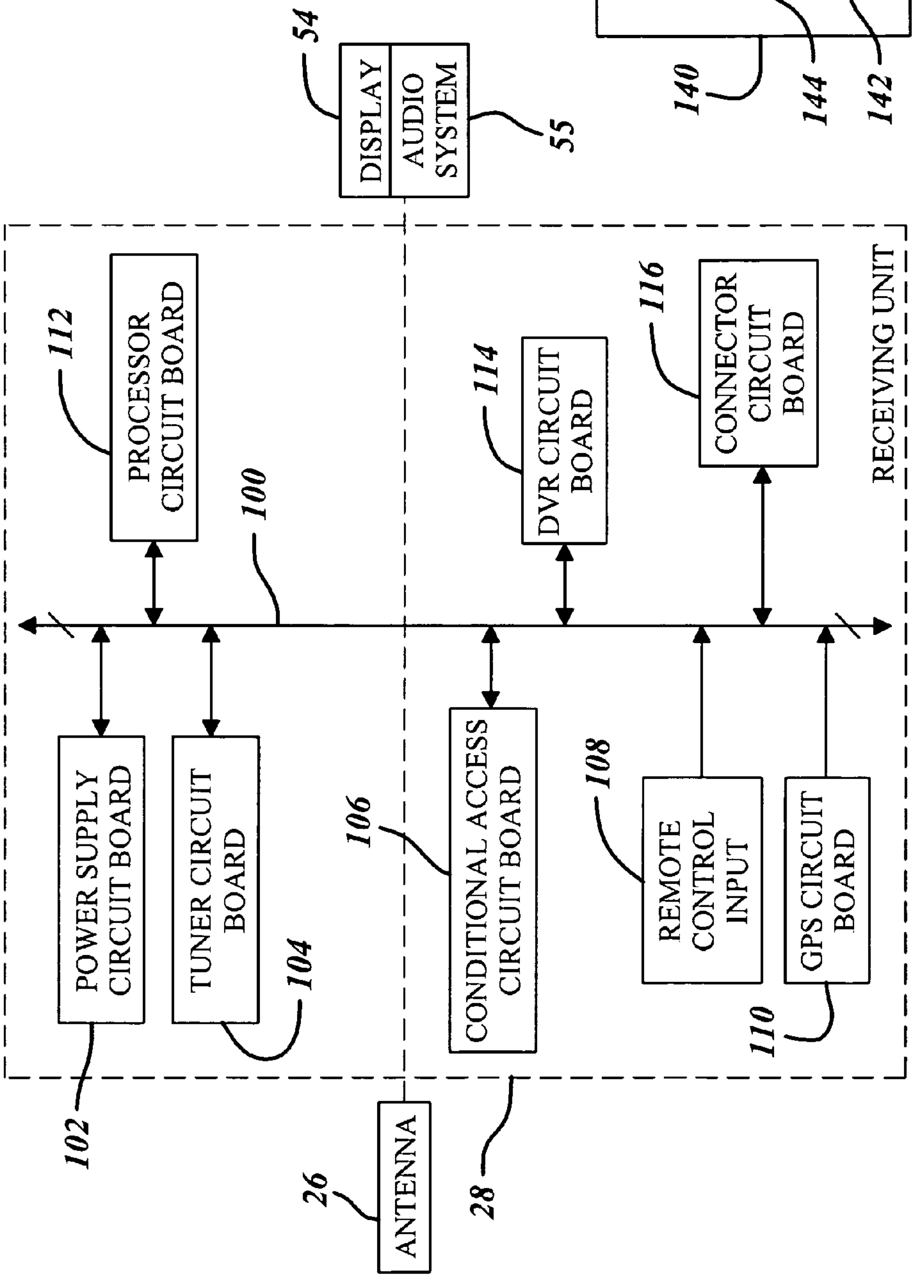
FIG. 3 is a block diagrammatic view of a receiver unit according to the present invention.

In FIG. 3, a receiver 28 having an integrated bus 100 may be provided with various circuit boards coupled thereto. The integrated bus 100 preferable includes a common pinout or bus line configuration for each of the circuit boards. The circuit boards may include power supply circuit board 102, a tuner circuit board 104, a conditional access circuit board 106, a remote control input 108, a GPS circuit board 110, processor board 112, a DVR circuit board 114 and a connector circuit board 116. Each of the circuit boards may communicate with the integrated bus 100.

It should be also noted that the antenna 26 may also be coupled directly to the integrated bus 100. The display 54 also may be coupled to the integrated bus.

The power supply circuit board 102 may be incorporated on one of the other boards. The remote control input 108 may also be incorporated on one of the other boards. The conditional access circuit board 106 may also be incorporated together with the power supply circuit board and/or the remote control circuit board. The GPS circuit board 110 may also be included on one or more of the other circuit boards. Likewise, the connector circuit board 116 may be coupled to any one of the circuit boards. It should also be noted that various combinations of more than one of the circuit boards illustrated may be combined together. The combination of the various circuit boards depends upon the desired functions of the system.

Figure 4:
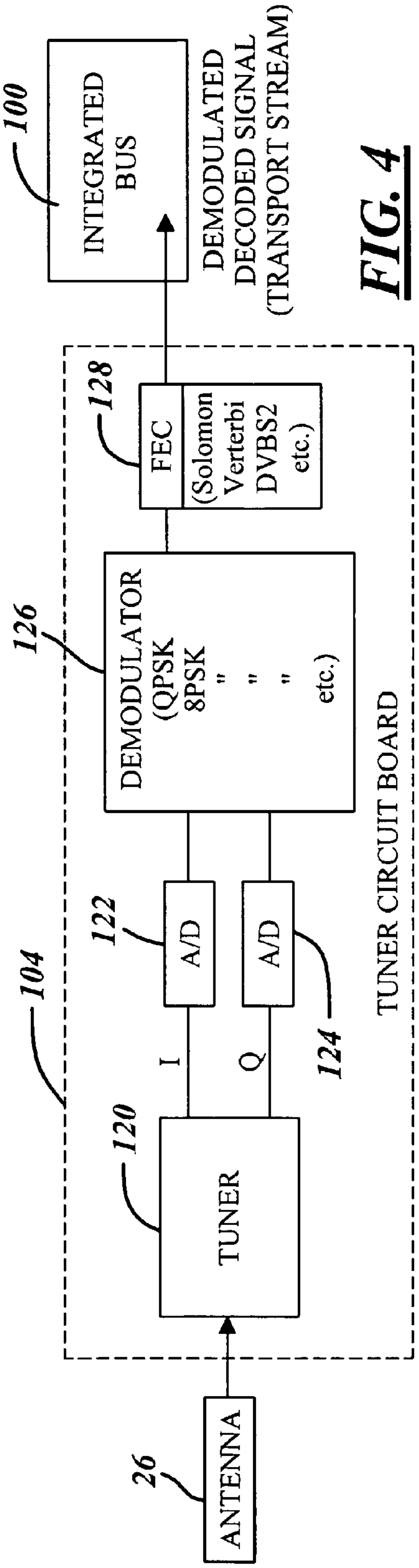
FIG. 4 is a block diagrammatic view of a tuner circuit board.

Referring now to FIG. 4, a tuner circuit board 104 is illustrated in further detail. The tuner circuit board 100 is in communication with the antenna 26. The antenna 26 receives the satellite signals. The tuner circuit board 104 may include a tuner 120, which separates the satellite signal into an I signal and a Q signal. A to D converters 122, 124 may also be provided which converts the respective analog I and Q signals to digital signals. A demodulator 126 may also be included on the tuner circuit board 104 as well a forward error correction module 128. The demodulator 126 may be QPSK or an 8PSK type of demodulator. The forward error correction module 128 may use Solomon, Verterbi or DVBS2 or the like. The output of the error correction module 128 is connected to the integrated bus 100. Thus, the forward error correction module 128 provides the demodulated and decoded signal which may be referred to as the transport stream.

Figure 5:
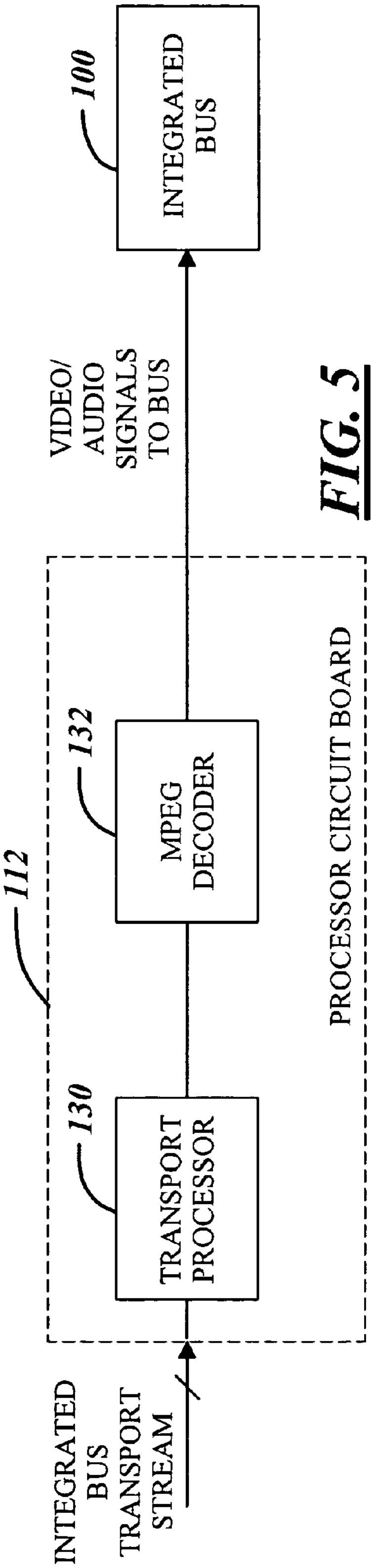
FIG. 5 is a block diagrammatic view of a processor circuit board.

Referring now to FIG. 5, the processor circuit board 112 is illustrated. The processor circuit board 112 receives the transport stream from the integrated bus 100 and outputs video and audio signals to the bus. The transport stream is provided to a transport processor 130 which then provides it to a decoder 132, which decodes the signal for the specific format. As illustrated, a decode 132 is an MPEG decoder, which generates video and audio signals to the bus 100. The video and audio signals may be provided to a connector on the processor circuit board or a connector on one of the other circuit boards. As will be illustrated below various RCA type jacks, S-video jacks or other types of jacks may be provided.

Figure 6:
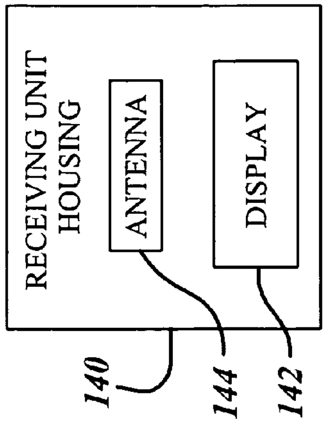
FIG. 6 is a block diagrammatic view of an integrated display with a receiver unit according to one aspect of the invention.

Referring now to FIG. 6, the receiver unit described above may be coupled to a separate display such as a television, a video player or the like. A receiver unit housing 140 may have a display 142 integrated thereon. A satellite antenna 144 may also be integrated thereon or therein to form a self-contained unit.

Figure 7:
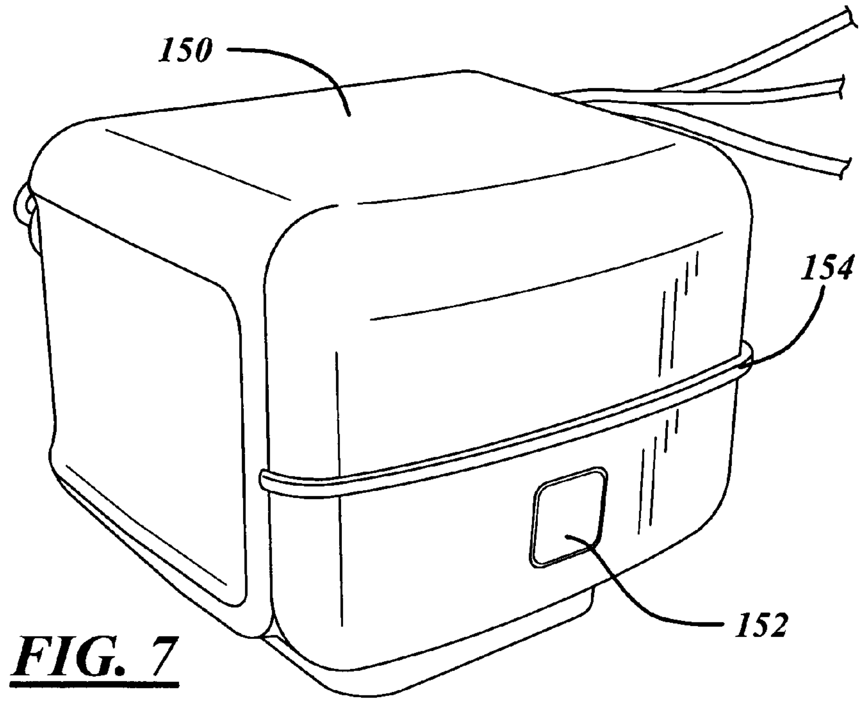
FIG. 7 is a perspective view of a housing according to another aspect of the invention.

Referring now to FIG. 7, a front view of a housing 154, the receiver unit, is illustrated. The receiver housing 150 has a button 152 thereon for powering the device. An illuminated bar 154 is also provided to convey to the user various selectable modes. The bar 154 may be illuminated by LEDs on the circuit boards.

Figure 8:
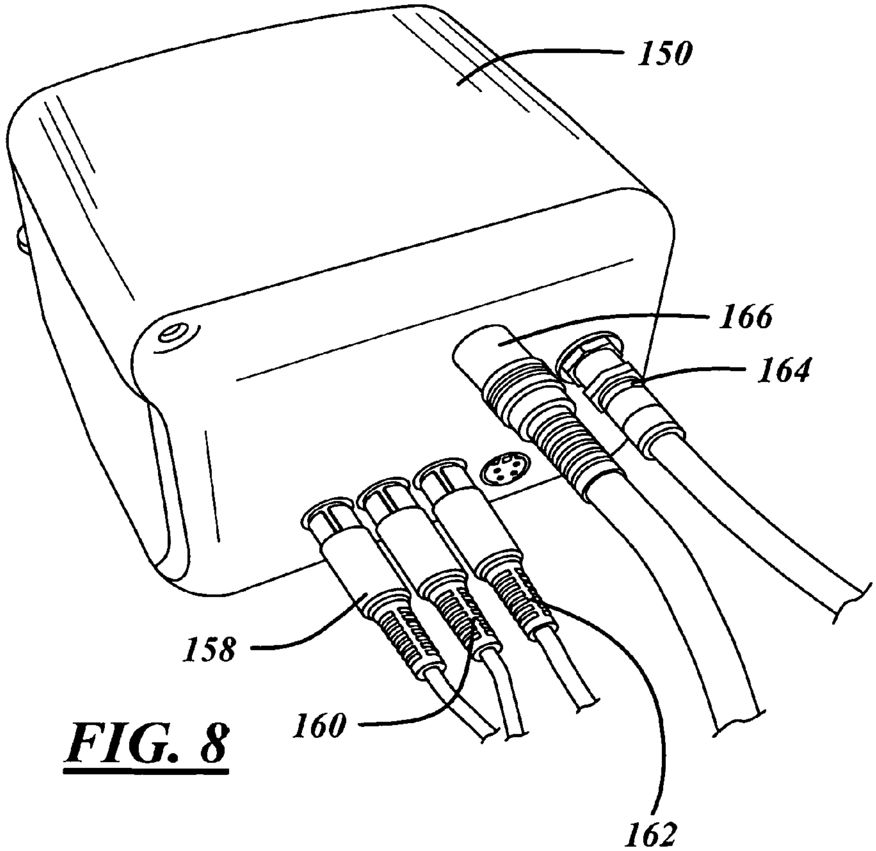
FIG. 8 is a rear view of the housing of FIG. 7.

Referring now to FIG. 8, the rear of the housing 150 is illustrated having a right audio cable 158, a left audio cable 160, a video cable 162, each an RCA connector. An antenna cable 164 and a power cable 166 are also coupled thereto.

Figure 9:
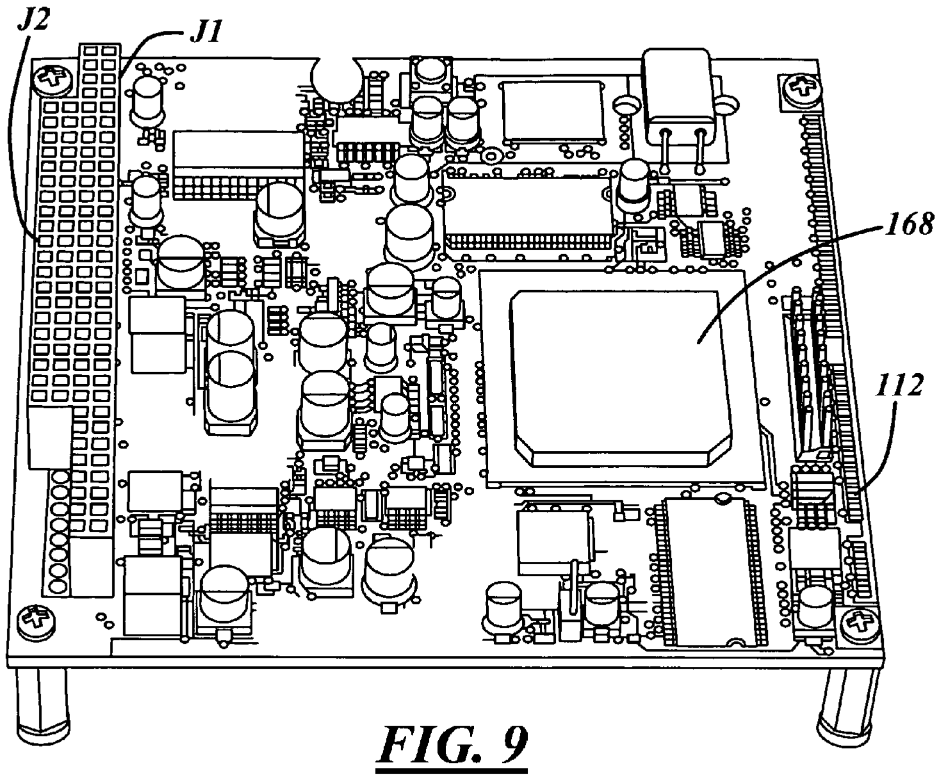
FIG. 9 is a perspective view of a processor circuit board.

Referring now to FIG. 9, the processor circuit board 112 is illustrated in further detail. The processor circuit board 112 includes a processor 168, a first connector J1 and a second connector J2. The first connector J1 and second connector J2 preferably together are in a first configuration which is common to each of the circuit boards. In all the circuit boards of the present application, various electronic components are illustrated in representative form. The number of components may vary depending on the types of devices implemented.

Figure 10:
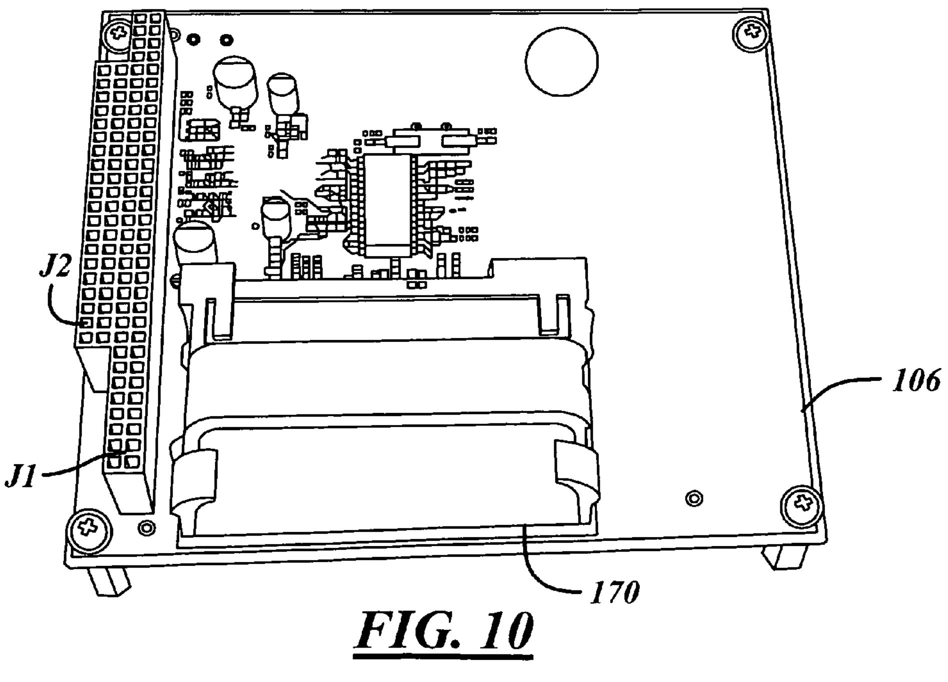
FIG. 10 is a perspective view of a conditional access circuit board without a conditional access card.
Figure 11:
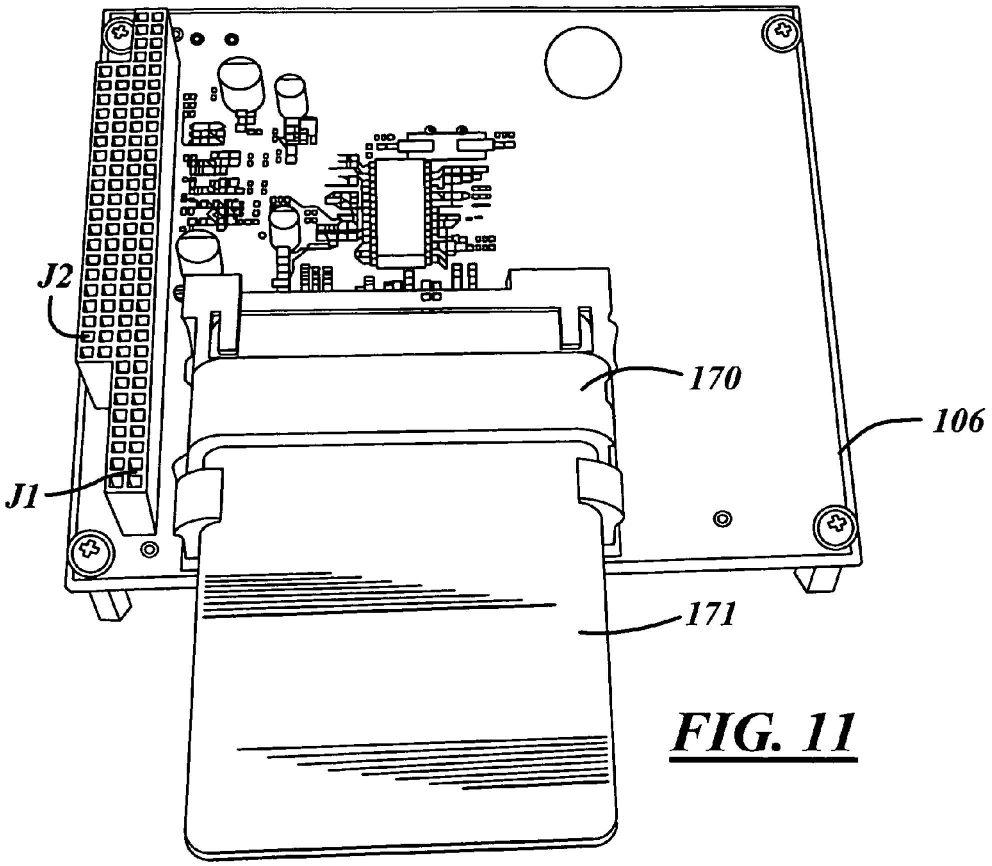
FIG. 11 is a perspective view of the conditional access card of FIG. 10 with the conditional access card therein.

Referring now to FIG. 10, a perspective view of a conditional access module circuit board 106 is illustrating also having connectors J1 and J2 coupled thereto. The conditional access module may include a card connector 170 that is used for receiving a conditional access card 171 as illustrated in FIG. 11.

Figure 12:
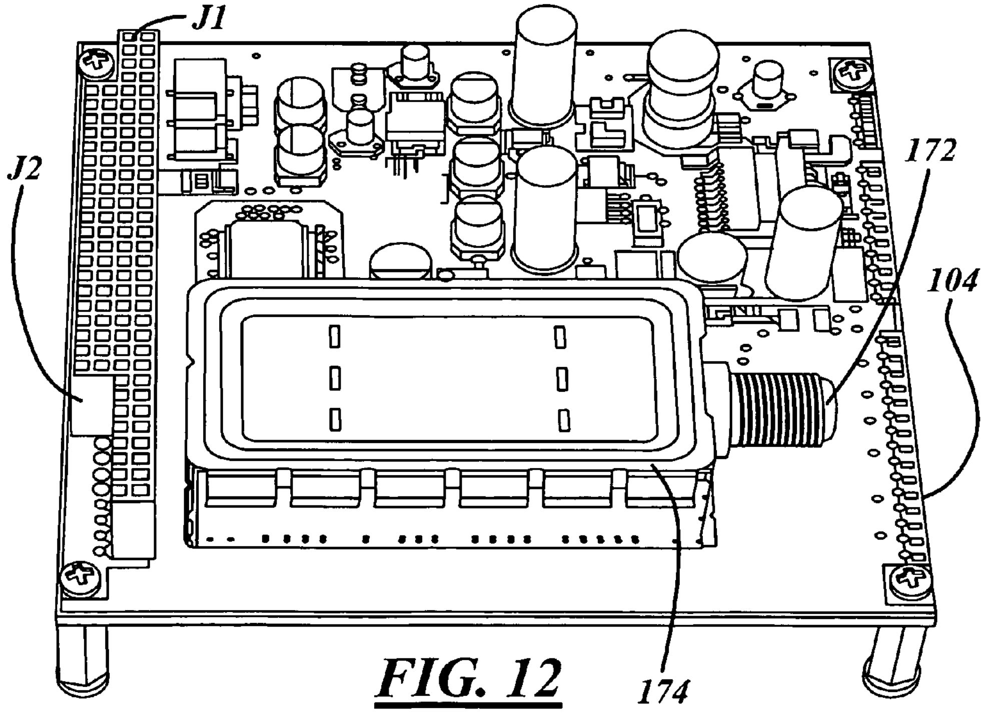
FIG. 12 is a perspective view of a tuner circuit board.

Referring now to FIG. 12, a tuner circuit board 104 is illustrated. The tuner circuit board 104 may include a connector 172 for coupling to an antenna. The connector 172 couples to a waveguide 174. As mentioned above, the tuner circuit board receives the satellite signal and demodulates and decodes the satellite signal to form another signal such as a transport stream signal that is coupled to the processor board. The transport stream signal may be coupled to the connectors J1 and J2.

Figure 13:
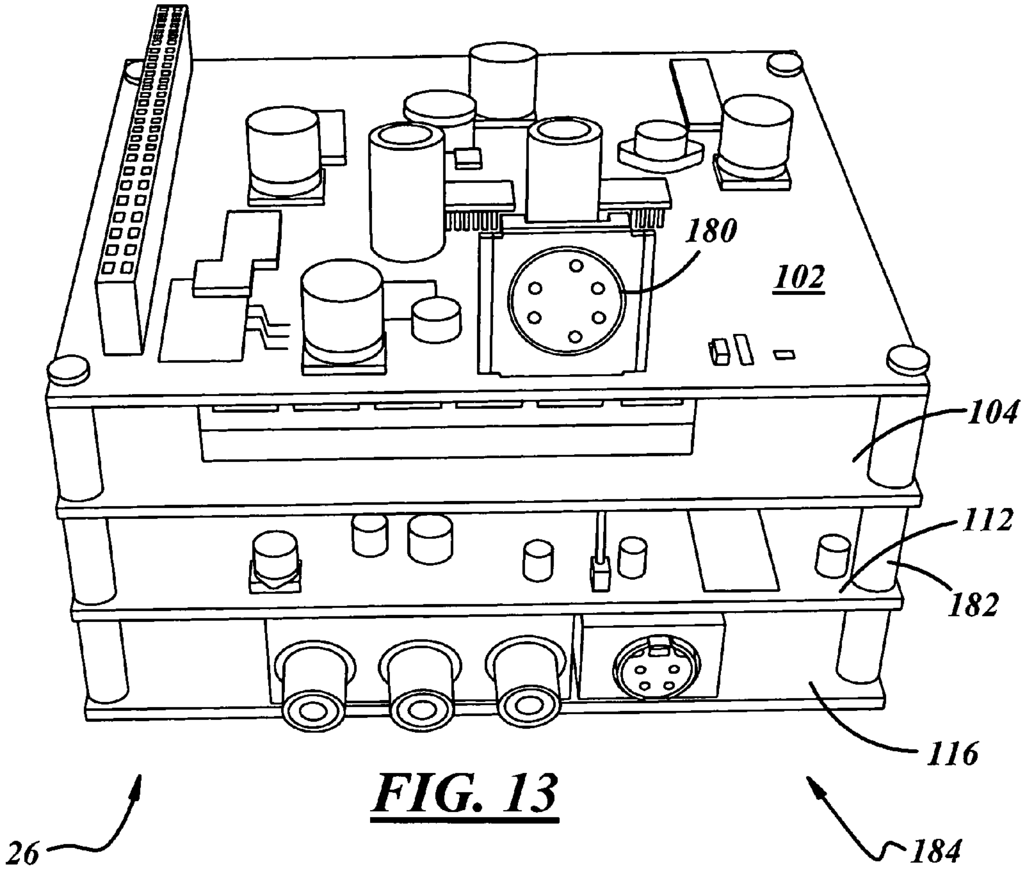
FIG. 13 is a perspective view of a circuit board stack having a power supply circuit, tuner circuit, a processor circuit and a connector circuit.

Referring now to FIG. 13, one embodiment of the receiving device is illustrated. A power supply or power conditioning circuit board 102 is illustrated as the top circuit board. The black connector 180 on the middle of the front top surface may be coupled to an AC or DC supply. In this embodiment, the supply is a DC supply. The middle top circuit board is a tuner circuit board 104 and the middle bottom circuit is a process circuit board 112 and the bottom is a connector circuit board 116. As will be noted, these circuit outputs correspond to FIG. 10. A plurality of stand-offs 182 may be used to separate the various circuit boards. Stand-offs 182 may be screwed together so that the boards remain securely and electrically fastened together. When secured together, the circuit boards form a stack 184.

Figure 14:
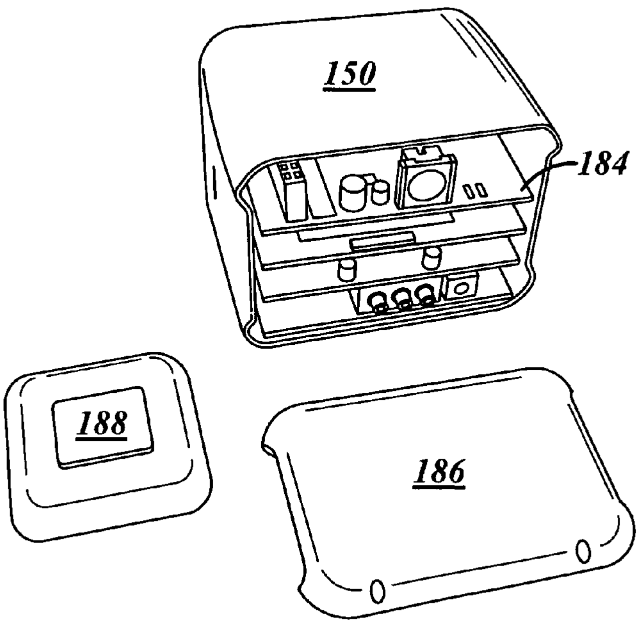
FIG. 14 is a perspective view of a housing having the stack of FIG. 13 therein.

Referring now to FIG. 14, a housing 150 having the stack 184 of FIG. 13 therein is illustrated. Covers 186 and 188 may be used to enclose the housing.

Referring now to FIG. 15, a perspective view illustrating a tuner circuit board 104 coupled to a processor circuit board 112 and which in turn is coupled to a combination circuit board having the power supply, conditional access and connector circuit board functions described above enclose thereon. The combination circuit board 200 provides a lower profile than that show in FIG. 13 but is wider. Depending on the various packaging constraint, various types of stacks may be desirable.

In this embodiment, it should also be noted that the antenna connector 172 for the tuner circuit board 104 is coupled through a wire to a second connector 202 for receiving the signals from the satellite antenna.

Referring now to FIG. 16, a table illustrating the pinouts of a J1 and J2 connector is illustrated with the various signals associated with each pin.

Referring now to FIGS. 18A and 18B, a table illustrating the signal name, the position on the J1, J2 or DIN connector, whether the signal is an input or output signal, the signal description and the type of signal are illustrated. In FIG. 19, a similar chart is illustrated for the various powers and grounds of the system.

Referring now to FIG. 17, a P1 connector that is not illustrated above may also be used in place of the J1 and J2 connectors. A P1 connector has three rows of connections illustrated by Row A, Row B and Row C. The various signals correspond to the same signals as FIG. 16.

In summary, depending on the various configurations of the device, various circuit boards may be included in a device. For example, a power supply circuit board may be eliminated if an external power supply such as a brick type power supply is plugged into the system. The integrated bus is important because it allows various functions such as power video data, audio and conditional axis to be provided. Thus, the order of the circuit boards in the stack does not matter. Various inputs such as a remote control input may be provided. Because the integrated bus includes so many different types of signals, the flexibility to add further boards, replace boards or the like becomes easy and cost effective.

While particular embodiments of the invention have been shown and described, numerous variations and alternate embodiments will occur to those skilled in the art. Accordingly, it is intended that the invention be limited only in terms of the appended claims.

What is claimed is:

1. A receiving unit comprising:

a tuner board receiving a satellite signal, said tuner board tuning, demodulating and decoding the satellite signal to form a second signal;

a processor board separated from the tuner board receiving the second signal and formatting the second signal to form an audio signal and a video signal;

an integrated bus coupling the tuner board and the processor board, said integrated bus communicating the second signal, the audio signal and the video signal; and a combination circuit board comprising a conditional access circuit, a power supply circuit and a connector circuit, said combination circuit board separate from the tuner board and processor board and coupling the satellite signal to the tuner board through a connector.

2. The receiving unit as recited in claim 1 wherein said conditional access circuit generating an access enable signal.

3. The receiving unit as recited in claim 1 wherein said connector circuit comprising a connector for coupling the combination circuit board to a display.

4. The receiving unit as recited in claim 3 wherein connector circuit comprises an audio connector, a video connector, an S-video connector and a coaxial connector.

5. The receiving unit as recited in claim 1 further comprising a digital video recorder circuit board coupled to the integrated bus.

6. The receiving unit as recited in claim 1 further comprising a remote control circuit board coupled to the integrated bus.

7. The receiving unit as recited in claim 1 wherein the processor board is disposed in a first plane and the tuner board is disposed in a second plane spaced apart from the first plane.

8. The receiving unit as recited in claim 1 wherein the integrated bus has a first pinout configuration, said tuner board having a first connector having the first pinout configuration, said combination circuit board having a second connector having the first pinout configuration.

9. The receiving unit as recited in claim 8 wherein the first connector is coupled to the second connector.

10. A satellite television receiving unit comprising a receiving unit as recited in claim 1.

11. A system comprising:

a tuner board receiving satellite signal from an antenna, said tuner board tuning, demodulating and decoding the satellite signal to form a second signal;

a processor board separated from the tuner board receiving the second signal and formatting the second signal to form an audio signal and a video signal;

an integrated bus coupling the tuner board and the processor board, said integrated bus communicating the second signal, the audio signal, the video signal, power and ground;

a combination circuit board comprising a conditional access circuit, a power supply circuit and a connector circuit, said combination circuit board separate from the tuner board and processor board and coupling the satellite signal to the tuner board through a connector;

a display in communication with the bus displaying the video signals; and an audio system in communication with the bus playing the audio signals.

12. The system as recited in claim 11 further comprising the antenna.

13. The system as recited in claim 11 wherein the satellite signal comprises a satellite television signal.

14. The system as recited in claim 11 wherein the display and the audio system are in communication with the bus through the connector circuit.

15. The system as recited in claim 11 wherein said conditional access circuit generating an access enable signal.

16. The system as recited in claim 11 further comprising a digital video recorder circuit board coupled to the integrated bus.

17. The system receiving unit as recited in claim 11 further comprising a remote control circuit board coupled to the integrated bus.

18. The system as recited in claim 11 wherein the processor board is disposed in a first plane and the tuner board is disposed in a second plane spaced apart from the first plane.

19. The system as recited in claim 11 wherein the integrated bus has a first pinout configuration, said tuner board having a first connector having the first pinout configuration, said combination circuit board having a second connector having the first pinout configuration.

20. The system as recited in claim 19 wherein the first connector is coupled to the second connector.

21. A method of comprising:

receiving satellite signals from an antenna at a tuner circuit board through a combination circuit board comprising a conditional access circuit, a power supply circuit and a connector circuit, said combination circuit board separate from the tuner board and a processor board;

tuning, demodulating and decoding the satellite signal to form a second signal at the tuner circuit board;

communicating the second signal through a bus;

receiving the second signal in the processor board;

formatting the second signal to form an audio signal and a video signal in the processor board;

communicating the audio and video signal through the bus; and displaying the video signal at a display.

22. The method as recited in claim 21 further comprising coupling the display to the connector circuit.

* * * * *